(12) United States Patent
Alsop

(10) Patent No.: US 7,479,783 B2
(45) Date of Patent: Jan. 20, 2009

(54) ECHO TRAIN PREPARATION FOR FAST SPIN-ECHO ACQUISITION

(75) Inventor: David Alsop, Newton, MA (US)

(73) Assignee: Beth Israel Deaconess Medical Center, Inc., Boston, MA (US)

(*) Notice: Subject to any disclaimer, the term of this patent is extended or adjusted under 35 U.S.C. 154(b) by 0 days.

(21) Appl. No.: 11/729,815

(22) Filed: Mar. 29, 2007

(65) Prior Publication Data
US 2008/0111547 A1 May 15, 2008

Related U.S. Application Data

(60) Provisional application No. 60/859,096, filed on Nov. 15, 2006.

(51) Int. Cl.
G01V 3/00 (2006.01)
(52) U.S. Cl. .................................. 324/307; 324/309
(58) Field of Classification Search ......... 324/300–322; 600/407–455
See application file for complete search history.

(56) References Cited

U.S. PATENT DOCUMENTS

| 5,448,170 | A  | * | 9/1995  | Bodenhausen et al. ...... 324/309 |
| 6,028,428 | A  | * | 2/2000  | Cunningham et al. ....... 324/314 |
| 6,268,728 | B1 | * | 7/2001  | Morrell ....................... 324/307 |
| 6,566,873 | B1 | * | 5/2003  | Smith et al. ................. 324/300 |
| 6,850,063 | B2 |   | 2/2005  | Hennig |
| 6,956,374 | B2 | * | 10/2005 | Busse ......................... 324/314 |
| 7,164,268 | B2 | * | 1/2007  | Mugler et al. ............... 324/307 |
| 2007/0078333 | A1 | * | 4/2007 | Abe et al. ................... 600/420 |
| 2007/0188172 | A1 | * | 8/2007 | Garwood et al. ............ 324/310 |

OTHER PUBLICATIONS

D. C. Alsop, "The Sensitivity of Low Flip Angle RARE Imaging," Magnetic Resonance in Medicine, 1997, vol. 37, pp. 176-184.
S. Conolly, J. Pauly, D. Nishimura, and A. Macovski, "Two-Dimensional Selective Adiabatic Pulses," Magnetic Resonance in Medicine, 1992, vol. 24, pp. 302-313.
J. Hennig, M. Weigel, and K. Scheffler, "Multiecho Sequences with Variable Refocusing Flip Angles: Optimization of Signal Behavior Using Smooth Transitions Between Pseudo Steady States (TRAPS)," Magnetic Resonance in Medicine, 2003, vol. 49, pp. 527-535.
M. S. Silver and R. I. Joseph, "Selective Spin Inversion in Nuclear Magnetic Resonance and Coherent Optics through an Exact Solution of the Bloch-Riccati Equation," Physical Review A, Apr. 1985, vol. 31, No. 4, pp. 2753-2755.

* cited by examiner

*Primary Examiner*—Brij B Shrivastav
(74) *Attorney, Agent, or Firm*—Wolf, Greenfield & Sacks, P.C.

(57) ABSTRACT

In one aspect, a method of inducing nuclear magnetic resonance (NMR) signals from a region of an object to be imaged is provided. The method comprises applying to the region a preparation sequence configured to substantially establish a zero flip-angle pseudo steady state (PSS) for the region, applying to the region a transitioning sequence configured to transition the zero flip-angle PSS to a higher target flip-angle PSS, and applying a radio frequency (RF) pulse sequence configured to cause the region to emit detectable NMR signals.

42 Claims, 10 Drawing Sheets

ECHO TRAIN PREPARATION FOR FAST SPIN-ECHO ACQUISITION

RELATED APPLICATION

This application claims priority under 35 U.S.C. § 119(e) to U.S. Provisional Application Ser. No. 60/859,096, entitled "APPROACH TO PREPARING AN ECHO TRAIN FOR FAST SPIN-ECHO ACQUISITION," filed on Nov. 15, 2006, which is herein incorporated by reference in its entirety.

FIELD OF THE INVENTION

The present invention relates to magnetic resonance imaging (MRI), and in particular to MRI performed using a spin-echo technique.

BACKGROUND OF INVENTION

Magnetic resonance imaging (MRI) is a technique used frequently in medical settings to produce images of the inside of the human body. MRI is based on detecting nuclear magnetic resonance (NMR) signals, which are electromagnetic waves emitted by atomic nuclei in response to state changes resulting from applied electromagnetic fields. In particular, magnetic resonance (MR) techniques involve detecting NMR signals produced upon the re-alignment or relaxation of the nuclear spin of atoms in the tissue of the human body. MR techniques may be used to image and study the properties of tissue in a variety of regions of the human body, for example, for detection and/or diagnosis of tissue anomalies, study of blood flow, etc.

During an MRI procedure, NMR signals emitted from a volume of interest or from a slice (i.e., a relatively thin region) of the volume of interest are detected. The detected NMR signals may then be reconstructed to form a two-dimensional (2D) image of the slice. A 2D image is comprised of pixels, each pixel having an intensity (e.g., a magnitude or value) that is proportional to the strength of the NMR signal emitted by a corresponding location in the volume of interest. A plurality of such 2D images reconstructed from NMR signal data obtained from successive slices may be stacked together to form a three-dimensional (3D) image. A 3D image is composed of voxels, each voxel having an intensity proportional to the strength of the NMR signal emitted from a corresponding portion of the volume of interest.

As discussed above, MRI exploits the NMR phenomenon to distinguish various tissue characteristics. In particular, MRI operates by manipulating the spin characteristics of tissue, and more specifically, spin characteristics of hydrogen atoms (e.g., in water molecules) which compose a significant proportion of the human body, including both blood, tissue and fat. MRI techniques include aligning the spins of hydrogen nuclei with an axial magnetic field $B_0$, and then perturbing the magnetic field in a targeted region with one or more radio frequency (RF) magnetic fields $B_1$.

The NMR phenomenon results from exciting hydrogen nuclei by generating RF signals $B_1$ at the Larmor frequency and applying them to a region of interest. The Larmor frequency is related to the rate at which nuclear spins precess about an axis at which the spins are aligned, which rate is, in turn, proportional to the strength of the axial magnetic field $B_0$. When applied, the RF magnetic field $B_1$ causes the nuclear spins to change orientation, and causes some nuclei to achieve a higher energy state.

When the RF signal $B_1$ subsides, the nuclear spins realign with the axial magnetic field $B_0$. Those nuclei that achieved the higher energy state upon excitation, return to the lower energy state by releasing electromagnetic energy. The released electromagnetic energy may be detected as NMR signals and used to form one or more images representative of the tissue type in the region of interest. The NMR signals may be detected using one or more RF coils sensitive to electromagnetic changes caused by the NMR signals, as discussed in further detail below.

The NMR phenomenon may be invoked in a number of ways. Conventional methods include applying the magnetic field $B_1$ in a pulse sequence, referred to herein as an RF pulse sequence. One pulse sequence, commonly referred to as a spin-echo pulse sequence, includes applying an RF excitation signal (also known as an excitation pulse), followed by one or more RF refocusing signals (also known as refocusing pulses) to create a spin-echo, as described in connection with FIGS. 1A and 1B, which illustrates the magnetic field geometry in a coordinate frame 100.

With reference to the illustrated coordinate frame 100, the magnetic field $B_0$ may be applied in substantial alignment with the z-axis. As will be appreciated by those skilled in the art, applying the magnetic field $B_0$ along the z-axis will cause spins to align in one of two configurations: 1) a low energy configuration in which spins align in the -Z direction; and 2) a high energy configuration in which spins align in the +Z direction. The spin property of atomic nuclei can be viewed as a magnetic moment. When aligned in the +Z direction, the magnetic moment vector is similarly aligned in the +Z direction. Likewise, spins aligned in the -Z direction have a magnetic moment vector aligned in the -Z direction.

When a region of interest is placed in magnetic field $B_0$, more spins will align in the +Z direction than in the -Z direction (i.e., more spins will orient themselves according to the high energy configuration). As a result, the region of interest will have a net magnetization vector M oriented in the Z direction. That is, the net magnetization vector M will have a relatively large $M_z$ component, and substantially zero $M_x$ and $M_y$ components. The magnitude of the $M_z$ component will depend, at least in part, on the strength of magnetic field $B_0$. The configuration illustrated in FIG. 1A is referred to as the equilibrium state.

When an appropriate RF pulse is applied at 90° to the z-axis (e.g., applied substantially parallel to the XY plane, as illustrated by magnetic field $B_1$ in FIG. 1B), spins may be perturbed from their equilibrium state in alignment with the axial magnetic field $B_0$ such that the net magnetization vector M is rotated into the XY plane. FIG. 1B illustrates the magnetic field geometry after a 90° excitation pulse has been applied, and the spins have been rotated 90° from their alignment with the axial magnetic field $B_0$ (Z-axis) to be aligned with the Y-axis. As shown, the component $M_z$ goes substantially to zero, and the $M_{xy}$ component (referred to as the transverse component) becomes relatively large.

With the net magnetization vector aligned in the XY plane (referred to as the transverse plane), the spins will precess about the Z-axis at the Larmor frequency. That is, the net magnetization vector will rotate about the Z-axis as illustrated by arrow 121 in FIG. 1B. After the RF pulse subsides and is no longer influencing the region of interest, the spins begin to re-align with magnetic field $B_0$, returning to the equilibrium state along the z-axis. The time constant governing how the net magnetization vector returns to equilibrium is referred to as the spin relaxation time ($T_1$). That is, $T_1$ describes the rate at which the net magnetization vector regains its equilibrium component in the direction of magnetic field (e.g., the rate at which the $M_z$ component of the net magnetization is recovered).

As discussed above, the application of the 90° RF pulse causes the net magnetization vector to rotate to the XY plane. As a result, the net magnetization vector obtains a substantial component $M_{xy}$. As the net magnetization vector precesses about the z-axis, the spins begin to dephase at different locations within the excited region. There are a number of reasons for the dephasing. First, atomic nuclei are influenced by slightly different magnetic field strengths (e.g., as a result of inhomogeneities in the applied magnetic fields), resulting in the various spins precessing at slightly different Larmor frequencies. In addition, the chemical environment may cause spins to precess at different rates, and magnetic field gradients used to localize NMR effects may also contribute to spin dephasing. As a result of dephasing, the component of the net magnetization vector in the XY plane (i.e., $M_{xy}$) decays to zero or substantially zero. The time constant governing the decay of $M_{xy}$ is referred to as the transverse relaxation or spin-spin relaxation time ($T_2$). $T_2$ depends at least upon various molecular interactions and generally microscopic inhomogeneities in the applied magnetic fields.

Following the 90° excitation pulse, a 180° RF pulse (referred to as a refocusing pulse) may be applied to cause the phases to regain coherence, recovering the transverse magnetization (e.g., recovering $M_{xy}$). The recovery of the transverse magnetization subsequently produces an NMR signal referred to as a spin-echo. The spin-echo may be detected to characterize the subject matter of the region of interest (e.g., to ascertain the hydrogen concentration characteristic of particular tissues in the body). It should be appreciated that spin lattice and spin-spin relaxation occurs simultaneously. That is, spin dephasing occurs simultaneously with realignment of the net magnetization vector with the z-axis, though at different rates. In particular, $T_2$ can be no larger and is typically substantially smaller than $T_1$.

Spin-echo pulse sequences typically include applying a 90° RF pulse followed by one or more 180° RF pulses as illustrated in FIGS. 2A and 2B. In particular, one conventional spin-echo pulse sequence is illustrated in FIG. 2A, wherein a 90° RF excitation pulse is configured to rotate the net magnetization vector M into the XY plane, where the spins begin to dephase causing the transverse magnetization $M_{xy}$ to decay. After some interval, a 180° RF refocusing pulse may be applied to align the spin phases. As result of the refocusing pulse, a spin-echo S is generated which can be detected by RF coils (e.g., the RF coils configured to deliver the RF pulse sequences). At some later point related to $T_1$, the magnetization vector recovers the equilibrium state and the process (e.g., an excitation pulse, followed by a refocusing pulse) may be repeated to obtain sufficient NMR data to characterize a region being imaged.

One variant on the spin-echo pulse sequence is referred to as the fast spin-echo (FSE) sequence. FSE exploits the fact that $T_2$ is typically substantially smaller than $T_1$. Accordingly, a plurality of refocusing pulses may be applied between successive applications of excitation pulses, as illustrated in FIG. 2B. In particular, the FSE pulse sequence may include an initial RF excitation signal (e.g., a 90° pulse) followed by a series of RF refocusing signals (e.g., a series of 180° pulse). As a result, multiple spin-echoes may be detected for each excitation pulse, increasing the speed of image acquisition.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1A:
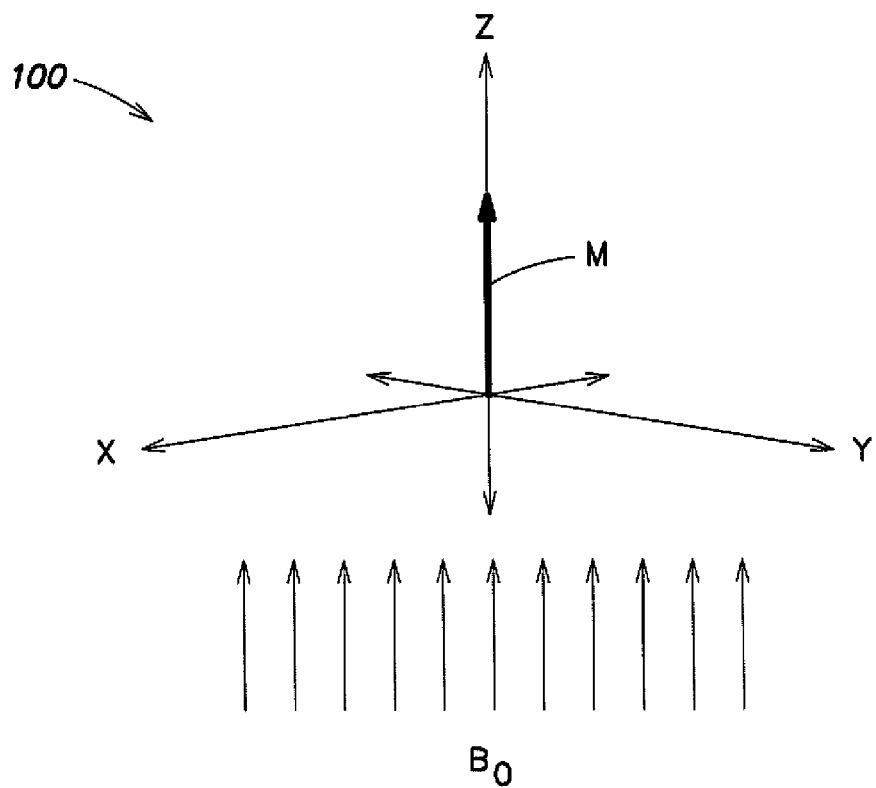
FIGS. 1A and 1B illustrate the magnetic field geometry of a region in an equilibrium state and after an 90° excitation pulse has been applied, respectively.
Figure 1B:
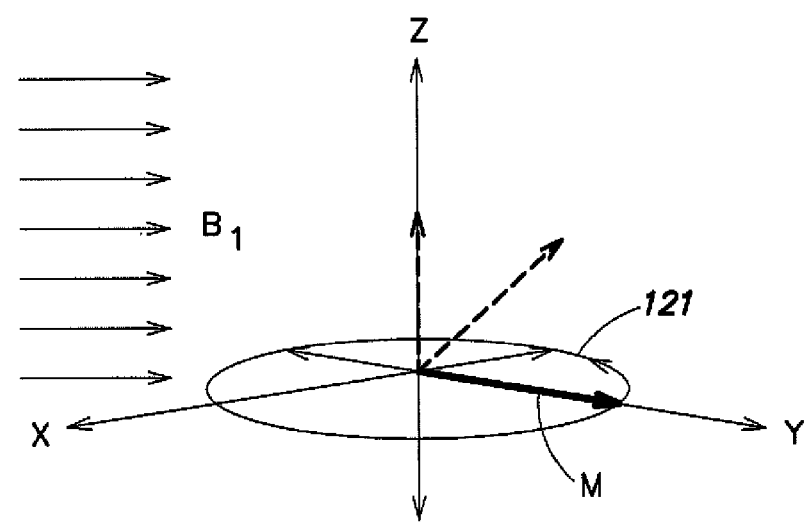
Figure 2A:
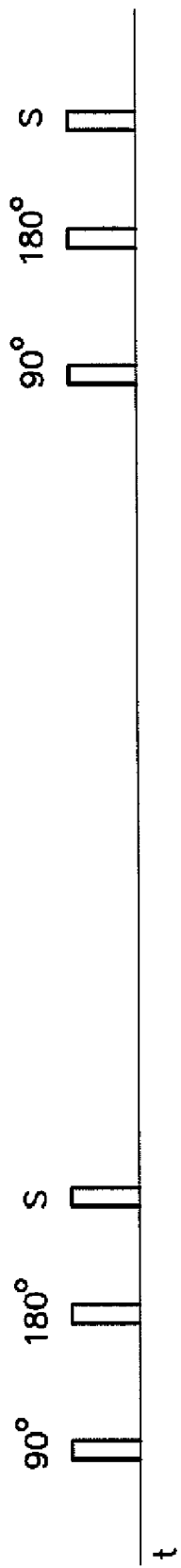
FIGS. 2A and 2B are timing diagrams for a spin-echo and fast spin-echo sequence respectively.
Figure 2B:
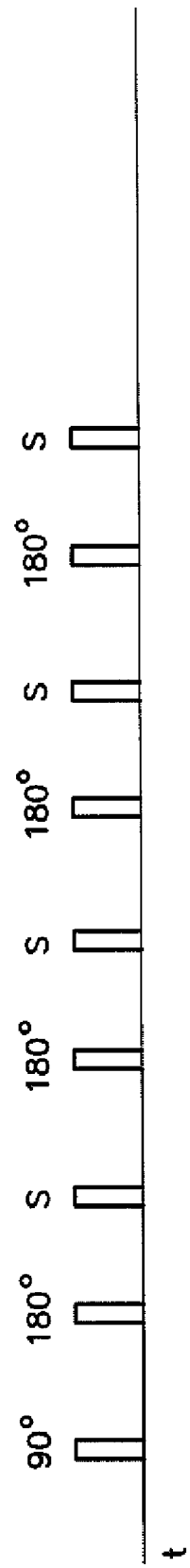

As discussed above, many conventional RF pulse sequences (e.g., spin-echo and fast spin-echo pulse sequences) begin with a 90° excitation pulse to rotate the net magnetization vector into the transverse plane, and are followed by one or more 180° refocusing pulses applied to periodically align the phases of the precessing spins to generate a spin-echo that can be detected and used to characterize a region being imaged. Ideally, an 180° flip-angle of the spins is achieved with each successive refocusing pulse, as, in general, the larger the flip-angle (up to 180°) the larger the magnitude or amplitude of the resulting spin-echo. That is, as the flip-angle increases, the magnitude of the emitted NMR signal (e.g., the spin-echo) also increases. Higher amplitude NMR signals tend to increase the signal to noise ratio of the NMR data, improving the sensitivity, resolution and/or quality of resulting images.

The term "flip-angle" refers to the angle (with respect to a reference angle) at which spins are rotated after application of an RF pulse. For example, in an ideal conventional FSE, the applied RF pulse sequence would achieve a 90° excitation flip-angle and successive 180° refocusing flip-angles. However, in practice it may not be possible to achieve ideal flip-angles, or even to know what flip-angles are being effectively achieved. With respect to the refocusing flip-angles, a number of factors influence the precise flip-angle achieved, which in turn varies as a function of location. For example, field inhomogeneities, and particular, inhomogeneity of the applied RF used for the refocusing pulses, may reduce the effectiveness of the pulses in certain areas, thus reducing the flip-angles achieved in practice.

RF field inhomogeneities result, at least in part, from the object being imaged acting as a load. For example, electromagnetic properties of the object being imaged (e.g., the human body) interact with the magnetic fields, disrupting the uniformity of the applied magnetic fields. For example, dielectric properties of the object (e.g., conductivity, permittivity, permeability, etc.) change how applied RF fields interact with the tissue, causing the spin rotation angles resulting from the applied RF fields to vary with location. Since the dielectric properties of the object vary as function of location, the RF field strengths will exhibit the same spatial variation.

In addition, various structures of the object may impact the applied fields in different ways. For example, the abdomen and pelvis regions of the human body tend to attenuate RF signals, thus reducing signal strength in those regions. Both effects are exacerbated at high field strengths due, in part, to the corresponding increase in the frequency of the applied RF fields. Thus, field inhomogeneity may result in an applied RF refocusing pulse having different effects on spin in different regions, causing the achieved flip-angle to vary as a function of location. In addition, magnetic field gradients (e.g., gradients in the magnetic field $B_0$) used to localize NMR effects also result in variation of the refocusing flip angle as a function of location.

In addition, the chemical environment of a targeted region also effects the flip-angle achieved by any given refocusing pulse. In particular, the precession rate, referred to herein as "frequency" varies across different tissue types. For example, hydrogen atoms in fatty tissue will have a different frequency than hydrogen atoms in muscle tissue. As a result, an applied refocusing pulse will "match" in frequency some regions better than other regions, causing spatial variation in the flip-angle over the targeted region.

Because the individual flip-angles for nuclei in different regions vary as a function of the properties of the object being imaged, the NMR signal strengths will likewise vary over the object. This variation in NMR signal strength results in artifacts in the images. In particular, regions of the object that undergo relatively small flip-angles will emit relatively small NMR signals, reducing the SNR and resulting in relatively low contrast image data in the associated region of the image. Accordingly, in conventional MRI imaging, image quality may be negatively impacted by variation in flip-angles resulting from the various factors described above, and particularly, as a result of field inhomogeneities of the applied magnetic fields.

While NMR signal strengths may be increased using higher field strengths, higher energy RF fields result in higher RF power deposition. For in-vivo MRI imaging, there may be limits on the RF power levels that will be tolerated in view of safety concerns. In particular, there are RF power deposition levels over which absorbing tissue may be damaged or otherwise harmed. Furthermore, higher field strengths complicate MRI in other ways as well (e.g., field homogeneity is more difficult to achieve using higher field strengths). As a result, the partial solution provided by using elevated field strengths to increase the SNR of signal acquisition may not be available or practical for many medical imaging procedures.

Accordingly, pulse sequences that achieve more uniform signal intensity in the presence of non-uniform flip angles may be a key characteristic in the development of improved NMR. It has been recognized that magnetization may be beneficially transferred into a so-called pseudo-steady state (PSS) using a long sequence of equidistant, equal amplitude pulses. A PSS is characterized by a magnetization state that, once achieved, responds to RF refocusing pulses in a substantially stable manner, producing substantially constant amplitude spin-echoes that are highly insensitive to RF pulse amplitude (i.e., a PSS is generally resistant to RF field inhomogeneity).

Pseudo-steady states are discussed in further detail in: 1) "The Sensitivity of Low Flip Angle RARE Imaging," Magnetic Resonance in Medicine (MRM), 37:176-184 (1997), David Alsop; 2) "Multiecho Sequences With Variable Refocusing Flip Angles: Optimization of Signal Behavior Using Smooth Transitions Between Pseudo Steady States (TRAPS)," Magnetic Resonance in Medicine (MRM), 49:527-35 (2003), Hennig J. et al.; and 3) U.S. Pat. No. 6,850,063, all of which are herein incorporated by reference in their entireties.

Achieving a PSS may be desirable due to its observed insensitivity to RF amplitude. That is, once a PSS is achieved, the amplitude of the echo remains substantially constant despite variation in RF amplitude. As a result, constant amplitude echoes may be obtained generally despite RF field inhomogeneities. The relative insensitivity to field inhomogeneity reduces image artifacts in regions of low RF amplitude, producing higher quality images. In particular, even in regions of relatively low RF amplitude (e.g., regions effected by dielectric properties of the body, areas of areas with high water content such as edemas or ascites resulting from disease, etc.), substantially uniform amplitude spin-echoes may be achieved.

However, despite the desirable characteristics of pseudo-steady states, they have conventionally existed primarily in the theoretical sense. In particular, achieving a PSS in conventional practice is not trivial and may be impractical or impossible in many clinical situations. The pseudo-steady state is so named because the constant amplitude echoes are achievable only when ignoring relaxation effects. In practice, the constant amplitude echoes decay with $T_1$ and $T_2$. As a result, there are time constraints involved in achieving a PSS. More importantly, while a PSS is relatively insensitive to RF amplitude variation, achieving a PSS is not. That is, attempts to achieve a PSS are plagued by the uncertainties resulting from field inhomogeneities. In particular, field inhomogeneity frustrates attempts to establish a PSS. Since the flip angle achieved by a particular pulse sequence may be unknown and varies spatially, it is difficult to know what pulse sequence to apply to achieve a PSS, or what PSS to establish (e.g., a 60° flip-angle PSS is different than a 90° flip-angle PSS, etc.).

Various methods that attempt to achieve a PSS typically lose substantial signal in the process. That is, pulse sequences that are applied in an attempt to achieve a PSS may not result in any useable signal, and when and if a PSS is achieved, relaxation times may have seriously degraded any subsequent spin-echoes that may be obtained. Accordingly, the appreciation that pseudo-steady states produce reproducible constant amplitude echoes that are insensitive to RF amplitude variation has not been able to be utilized due to the substantial difficulty in achieving a pseudo-steady state.

Applicant has identified and developed a method of achieving a PSS in a sample that is also generally insensitive to RF field inhomogeneities. In particular, Applicant has developed a preparation sequence capable of achieving a first PSS generally despite RF field inhomogeneities. Once the first PSS has been achieved, a transitioning pulse sequence may be applied to increase the flip-angle of the PSS. In one embodiment, a preparation pulse sequence is generated and provided to the sample to condition the spins to achieve a zero flip-angle PSS. After the preparation sequence is applied, a transitioning pulse sequence may be applied to transfer the magnetization to pseudo-steady states having higher flip-angles until a desired flip-angle PSS is achieved. The transitioning pulse sequence may then be followed by a refocusing pulse sequence to obtain substantially constant amplitude echoes from the sample.

Following below are more detailed descriptions of various concepts related to, and embodiments of, methods and apparatus according to the present invention. It should be appreciated that various aspects of the invention described herein may be implemented in any of numerous ways. Examples of specific implementations are provided herein for illustrative purposes only. In addition, the various aspects of the invention described in the embodiments below may be used alone or in any combination, and are not limited to the combinations explicitly described herein.

Figure 3:
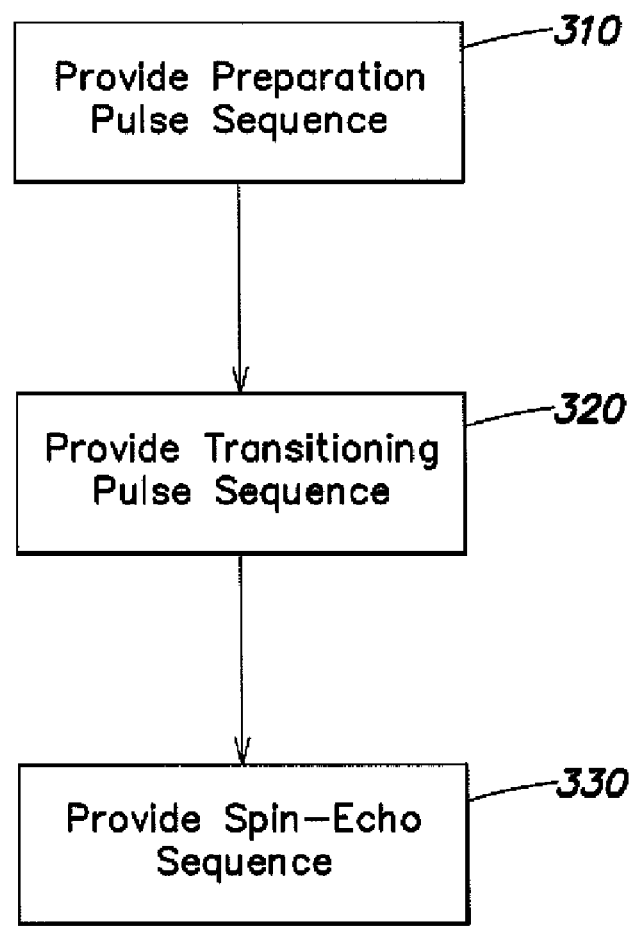
FIG. 3 is a flow chart illustrating a method of inducing NMR signals from a region, in accordance with some embodiments of the present invention.

FIG. 3 illustrates a method of obtaining NMR signals from a sample, in accordance with some embodiments of the present invention. Method 300 exploits several key insights. First, the method capitalizes on Applicant's discovery of a PSS that may be achieved generally despite RF field inhomogeneity. Second, method 300 utilizes the recognition that once a PSS has been achieved, the magnetization state of the PSS can be transferred into higher flip-angle pseudo-steady states. In particular, the initial PSS may be transformed into a PSS having a flip-angle that produces a desired NMR signal strength, signal-to-noise ratio, etc.

In act 310, a region of the sample is prepared for acquisition of NMR signals by applying an RF preparation pulse sequence configured to establish a substantially zero flip-angle PSS for the region. Applicant has determined that the zero flip-angle PSS may be achieved by establishing the magnetization in the region such that spins are either aligned or anti-aligned with the magnetic field $B_0$, and wherein the net magnetization vector over the region is substantially zero (magnetization properties which are characteristic of the zero flip-angle PSS). Whether the spins are aligned or anti-aligned with the magnetic field $B_0$ is a function of both location and frequency. An additional characteristic of a PSS, and more particularly, the zero flip-angle PSS, is that the magnetization state is conditioned such that it is capable of being transitioned to other pseudo steady states, as discussed in further detail below.

As discussed above, a substantial difficulty in achieving a target flip-angle PSS remains field homogeneity, which makes it difficult to provide the appropriate RF signal amplitudes to consistently produce the target flip-angle. For example, a pulse sequence designed to achieve a 60° may produce 50° flip-angles in some locations, 30° flip-angles in other locations, and other spatial flip-angle variation, all of which may be generally unknown. This variation in flip-angle frustrates attempts to establish the PSS. Thus, the same generally deleterious field characteristics for which the PSS is resistant make achieving a PSS exceedingly difficult in practice.

Applicant has discovered the existence of a zero flip-angle PSS that can be achieved in a manner that is highly resistant to RF field inhomogeneity. The relative ease by which the zero-flip angle PSS may be achieved is due, at least in part, to the fact that the zero-flip angle PSS does not rely on achieving a particular flip-angle, but rather relies on conditioning the magnetization state to a PSS. Because any flip-angle that is a fraction of zero is still zero, variation in field strength does not substantially effect achieving the zero flip-angle PSS, making its establishment generally insensitive to RF field variation. However, the zero-flip angle PSS does not produce a NMR signal because no $M_{xy}$ component is induced. Applicant has recognized that because the zero flip-angle PSS has the steady-state characteristics of other pseudo steady states (without the requirement of achieving a particular flip-angle), the zero flip-angle PSS can be transitioned to higher flip-angle pseudo steady states that produce consistent and detectable NMR signals, as discussed in further detail below.

As discussed above, standard FSE imaging begins with an excitation pulse of 90°. The magnetization produced by this excitation pulse is the same as the PSS for 180° refocusing pulses. Since the PSS of the spin echo train is not highly sensitive to refocusing flip angle and hence $B_1$ inhomogeneity, the sensitivity to flip angle is instead a result of the imperfect 90° excitation pulse and the slow and inefficient transition of magnetization to the steady state when the assumed flip angle is incorrect. Even if an adiabatic (insensitive to $B_1$) slice selective 90° is used, the transition of the PSS to the desired flip angle still depends upon the correct amplitudes of the initial refocusing pulses, since the transition must be from near the high refocusing pulse of 180°.

According to some embodiments, a preparation pulse sequence is used that prepares the magnetization for a PSS of a nearly 0° refocusing flip angle. After the preparation sequence is applied, the signal can then be transitioned up to the flip angle of interest. Unlike beginning in the 180° PSS, beginning in the 0° PSS will correctly ramp from near zero to the desired steady state flip angle, even if the initial refocusing pulses are of incorrect amplitudes. For this strategy to be insensitive to flip angle, Applicant developed an adiabatic approach to preparing the pseudo-steady state at a 0° refocusing pulse (i.e., a zero flip-angle PSS).

Neglecting relaxation, the transverse magnetization $M_{xy}$ (also referred to herein as $M_t$ in the description below) and the longitudinal magnetization ($M_z$) of the PSS are given by the equations [1] and [2] respectively, $$M_t = iM_0\left(1 + \left(\frac{\sin\alpha\sin\left(\frac{\phi}{2}\right)}{(1-\cos\alpha)}\right)^2\right)^{-\frac{1}{2}} \qquad [1]$$

$$M_z = -i\left(\frac{\sin\alpha\sin\left(\frac{\phi}{2}\right)}{(1-\cos\alpha)}\right)M_t \qquad [2]$$

where $\phi$ is the phase evolution between the refocusing pulses. For a refocusing flip angle of $\alpha=180°$, the $M_t$ approaches 1 (assuming $M_0=1$) and the $M_z$ approaches 0. In a standard FSE sequence, this is generated by a 90° excitation pulse that strives to place the magnetization in the 180° PSS. If the refocusing flip angle $\alpha$ approaches 0°, then $M_t$ becomes 0 and $M_z$ approaches a square wave magnetization.

Figure 4:
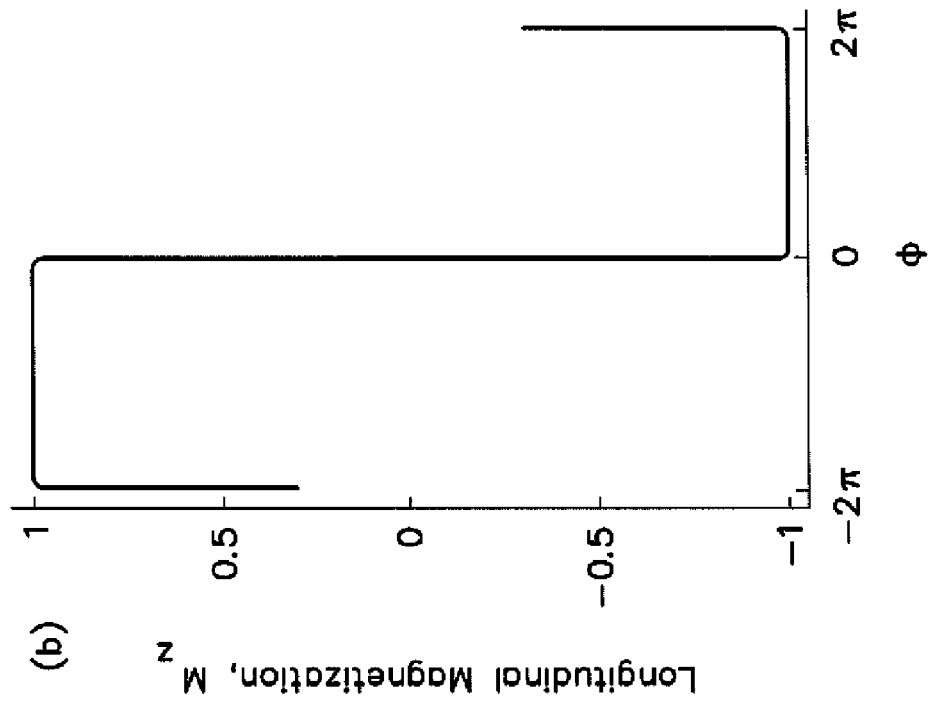
FIG. 4 illustrates the longitudinal and transverse magnetization in a zero flip-angle pseudo steady state, in accordance with some embodiments of the present invention.
Figure 4:
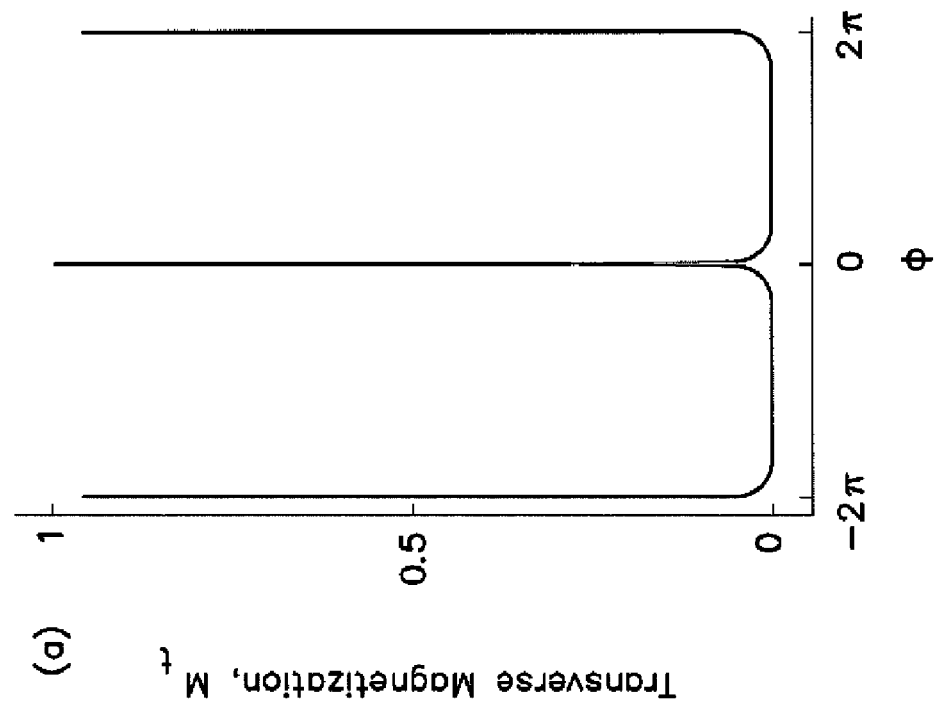

FIG. 4 illustrates the longitudinal ($M_z$) and transverse ($M_t$) magnetization as a function of phase evolution $\phi$ for a zero or near zero flip angle PSS. For the phase evolution ($\phi$) between $-2\pi$ and 0, $M_z$ is positive and between 0 and $2\pi$, $M_z$ is negative. As discussed above, once the magnetization is placed in the zero flip-angle PSS, then it can be efficiently transitioned to any desired flip angle PSS. Applicant has identified various pulse sequences capable of achieving a zero flip-angle PSS. According to some embodiments, the pulse sequence is designed to make a sharp inversion band that is adiabatic, or independent of applied RF power. One such adiabatic pulse may be represented as a hyperbolic-secant (HS) in which the complex RF pulse is given by the following, $$B_1(t) = B_{1\,max}[sech(\beta t)]^{1+iu} \qquad [3]$$

where β is a modulation angular frequency, μ is a dimensionless parameter, t is time and $B_{1\ max}$ is the maximum $B_1$ field. The parameters β and μ are chosen based on the following conditions:

$$\Delta f = \frac{\mu \beta}{\pi} \quad [4]$$

and $$B_{1\max} \gg \frac{\sqrt{\mu} \beta}{\gamma}$$

where Δf is the RF bandwidth and γ is the gyromagnetic ratio, to satisfy the condition of adiabatic property. In some embodiments, a pattern of discrete pulses is used to obtain the desired square wave magnetization. Thus, a discretely sampled version of the HS pulse may be used to create the square wave magnetization, which can be perceived as a shifted inversion band. It should be appreciated that other types of pulses may be used to achieve a desired magnetization, as the aspects of the invention are not limited in this respect.

Figure 5:
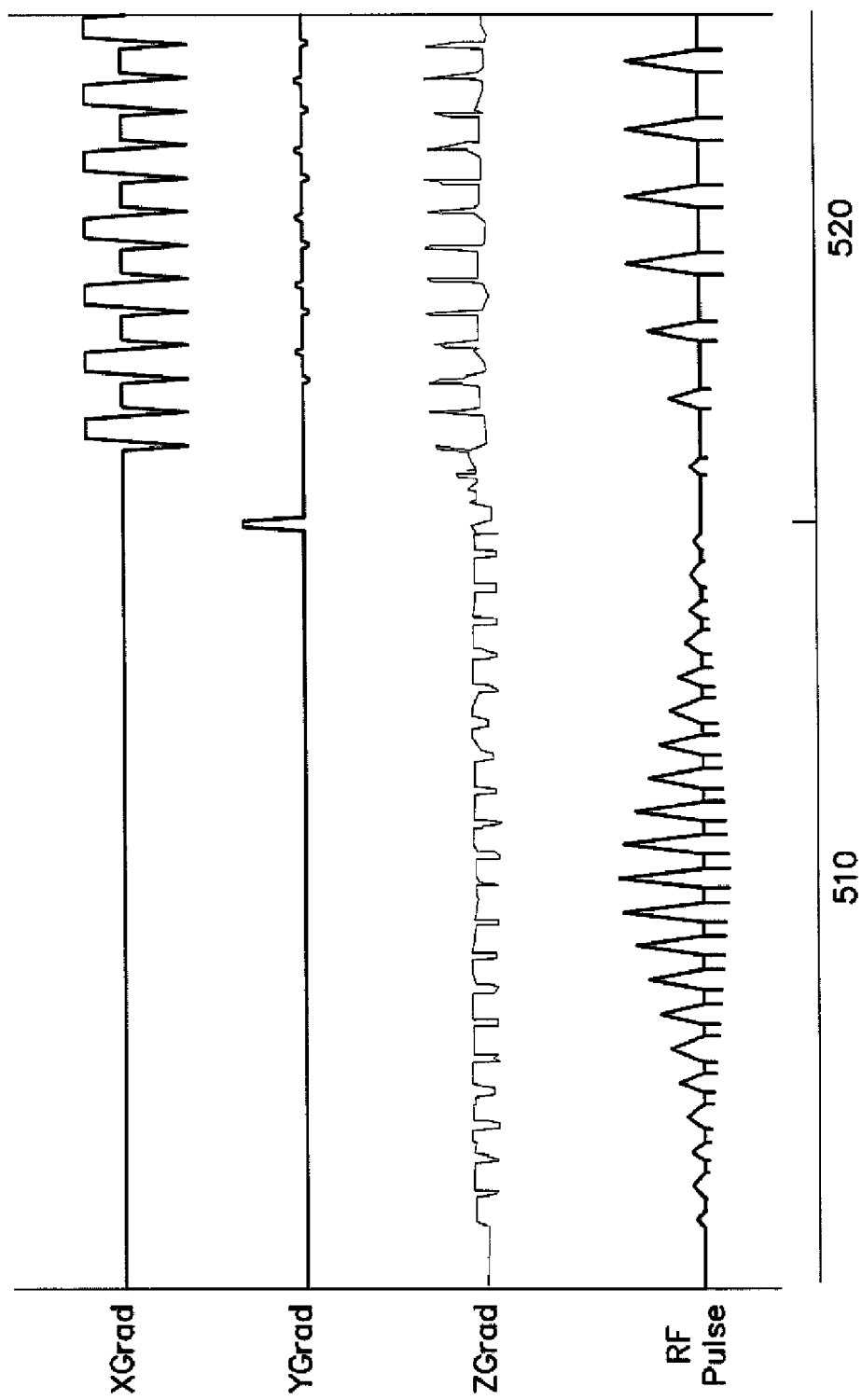
FIG. 5 illustrates a preparation pulse sequence, and a transitioning pulse sequence, in accordance with some embodiments of the present invention.

FIG. 5 illustrates a preparation pulse sequence capable of achieving a zero flip-angle PSS, in accordance with some embodiments of the present invention. It should be appreciated that each of the pulses illustrated in preparation pulse sequence 510 represents the amplitude envelope of the RF pulse, which oscillates under the envelope at a desired frequency (e.g., the Larmor frequency). In FIG. 5, the pulse sequence forming preparation pulse sequence 510 includes pulses that first increase and then decrease in magnitude substantially in the shape of a sinusoid. Preparation pulse sequence 520 is adapted to at least approximate a zero flip-angle PSS for a targeted region of the sample, such that at least some of the desirable characteristics of a PSS are achieved (e.g., the magnetization state has been conditioned to facilitate transfer to higher flip-angle pseudo steady states).

It should be appreciated that other suitable preparation pulse sequences may be used to prepare the region to establish or approximate a zero flip-angle PSS, and a variety of different techniques are possible For example, a number of sequences that gradually increase in magnitude during a first time interval and then gradually decrease in magnitude during a second time interval may be appropriate to condition the spins to achieve a zero flip-angle PSS. Other pulse sequences capable of achieving or closely approximating a zero flip-angle PSS may be used, as the aspects of the invention are not limited in this respect.

In some embodiments, the pulses in the preparation sequence may be spaced by a time period of half an echo spacing, however other intervals between pulses may be chosen, as the aspects of the invention are not limited in this respect. In addition, in some embodiments, the amplitude and phase of the pulses may be determined by using the Shinnar-LeRoux algorithm (e.g., as described in U.S. Pat. No. 5,153,515), though this is not a limitation on selecting the amplitudes and phases for RF pulses used in a preparation pulse sequence. The shape of the RF preparation pulse sequence may also be chosen to limit the amount of power deposition, and thus heating, that may occur during application. In some embodiments, the pulses may have the shape of a hyperbolic secant function sech(t), but this is merely one example and any of a variety of types of pulses may be used, in any number of different suitable pulse sequences.

In act 320, a transitioning pulse sequence may be applied to transition the established zero flip-angle PSS to a desired higher flip-angle PSS. As discussed above, a targeted region having achieved any arbitrary PSS (including the zero flip-angle PSS) can be transitioned relatively robustly to higher flip-angle pseudo-steady states. There exist various pulse sequences that are known to facilitate the magnetization rotations needed to transition between different pseudo steady states. Accordingly, following the preparation pulse sequence, a transitioning pulse sequence may be applied to increase the flip angle of the PSS into a range wherein NMR signals are produced at satisfactory signal strengths. It has been observed that applying an appropriate pulse sequence allows the magnetization state for a zero degree flip-angle PSS to be transferred into higher flip-angle pseudo steady states. Thus, to achieve a desired change in the flip-angle PSS, a pulse sequence may be applied that gradually transitions the flip-angle PSS from zero degrees to a higher flip-angle PSS.

FIG. 5 illustrates a transitioning pulse sequence capable of transitioning a zero flip-angle PSS to a higher flip-angle PSS, in accordance with some embodiments of the present invention. As with the preparation pulse sequence, each of the pulses illustrated in transitioning pulse sequence 520 represent the amplitude envelope of an oscillating RF field. In FIG. 5, the transitioning pulse sequence 520 includes pulses that ramp up to a maximum amplitude and level off for a predetermined number of pulses. Accordingly, the shape of the pulse sequence substantially follows a ramp curve. As the pulses increase in magnitude, the magnetization is transferred to higher flip-angle pseudo-steady states. The transitioning sequence can be designed to achieve any desired flip-angle PSS, as discussed in further detail below. Transitioning sequence 520 is one of many pulse sequences that may be suitable for transitioning an established PSS into a higher flip-angle PSS, and any pulse sequence capable of transferring the magnetization state from one PSS to another may be used, as the aspects of the invention are not limited in this respect.

In act 330, a sequence of one or more refocusing pulses may be applied to generate associated NMR signals (e.g., spin-echoes) that may be detected to form image data of the region of the sample. Since the spins have been conditioned and remain in a PSS, the resulting NMR signals (e.g., spin-echoes) are relatively insensitive to RF field variation and remain of substantially constant amplitude. By preparing and transitioning the spins so that a targeted flip-angle PSS is achieved, generally optimal strength spin-echoes may be produced by the refocusing pulses, increasing the signal-noise-ratio of the image acquisition process. It should be appreciated that any appropriate sequence of one or more refocusing pulses may be used to invoke spin-echoes, as the aspects of the invention are not limited in this respect. For example, any of various spin-echo, fast spin-echo, rapid acquisition with relaxation enhancement (RARE) sequences, etc., may be used to generate detectable NMR signals from the sample.

Figure 6:
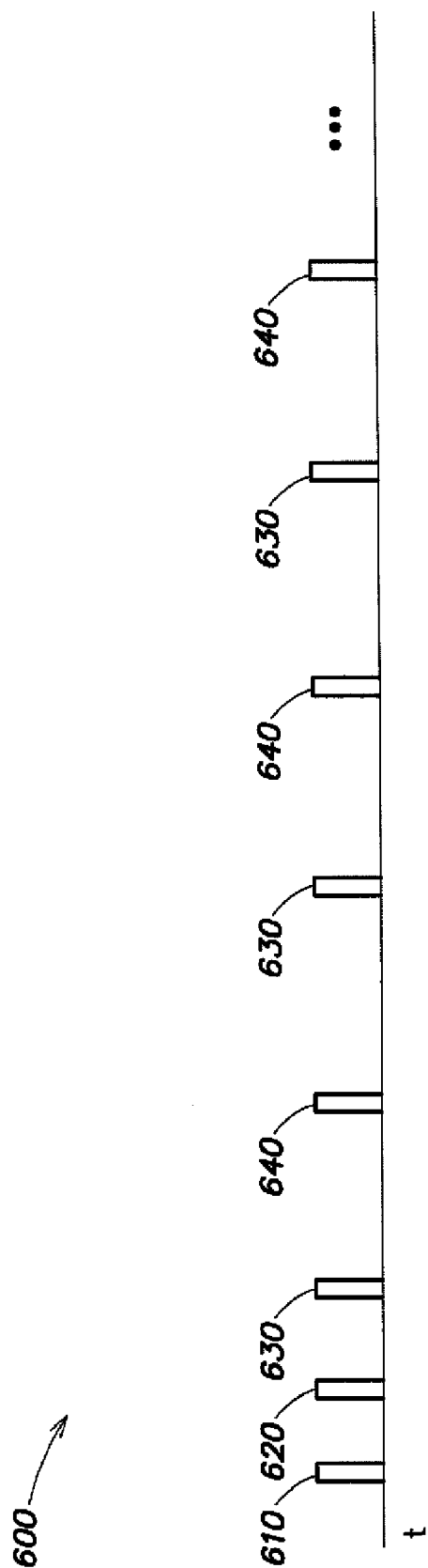
FIG. 6 is a timing diagram illustrating a preparation pulse sequence, a transitioning pulse sequence, and a refocusing pulse sequence, in accordance with some embodiments of the present invention.

FIG. 6 illustrates a timing diagram of RF preparation pulse sequence 610, RF transitioning pulse sequence 620 and a sequence of refocusing pulses 630, in accordance with some embodiments of the present invention. For example, timing diagram 600 may be used as the schedule for providing the preparation and transitioning pulse sequences illustrated in FIG. 5. In particular, RF preparation pulse sequence 610 may be applied to a region of a sample being imaged to establish a zero flip-angle PSS.

After the preparation pulse sequence 610 has been applied and the zero flip-angle PSS achieved or suitably approximated, transitioning pulse sequence 620 may be applied to transfer the magnetization of the zero flip-angle PSS to a higher target flip-angle PSS. After the target flip-angle PSS has been established, the region may be imaged using a spin-echo technique, such as FSE. If fast spin-echo imaging is used, a sequence of refocusing pulses may be applied, and an NMR signal S acquired in general synchronization with the spin re-alignment. In other embodiments, a single refocusing pulse may be applied between each repetition of preparation and transitioning pulse sequences. However, any number of refocusing pulse may be provided on each iteration, as the aspects of the invention are not limited in this respect.

It should be appreciated that in the embodiment illustrated in FIG. 6, no 90° excitation pulse is used to rotate the magnetization vector into the transverse plane. The application of the preparation and transitioning pulse sequences, in addition to establishing a target flip-angle PSS, effect a rotation of the net magnetization vector. That is, after application of the preparation and transitioning pulse sequence, the net magnetization vector will have been rotated into some plane between the z-axis and the transverse plane. However, despite the absence of a 90° excitation pulse in the sequence illustrated in FIG. 6, some preparation and transitioning pulse sequence combinations may include an excitation pulse, as the aspects of the invention are not limited in this respect.

As discussed above, conventional fast spin-echo sequences typically endeavor to achieve 180° flip-angle refocusing pulses. However, a major concern with this approach is RF power deposition within a subject being imaged. In particular, a series of compact 180° pulses may introduce more RF heating then is acceptable according to safety standards for in-vivo MRI imaging. However, in conventional pulse sequences, using lower flip-angle refocusing pulses may not present a viable solution to the power deposition problem due to the decrease in the amplitude of the resulting spin-echoes and the relatively significant degradation in SNR at low flip angles. However, Applicant has appreciated that lower flip-angle pseudo-steady states may provide satisfactory NMR signal strengths and SNR. That is, once a PSS has been achieved, the decrease in NMR signal strength and SNR as a function of flip-angle is substantially reduced.

Figure 7A:
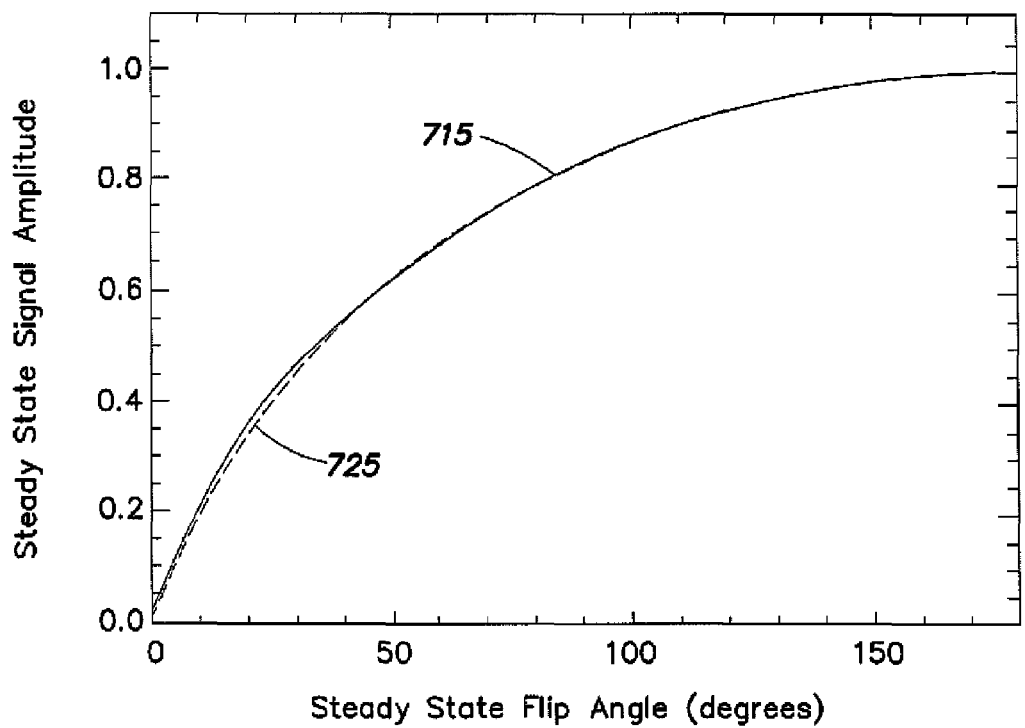
FIGS. 7A and 7B illustrate spin-echo signal strengths and signal-to-noise ratios versus flip-angle in pseudo steady states, respectively, that may be achieved using pulse sequence in accordance with some embodiments of the present invention.
Figure 7B:
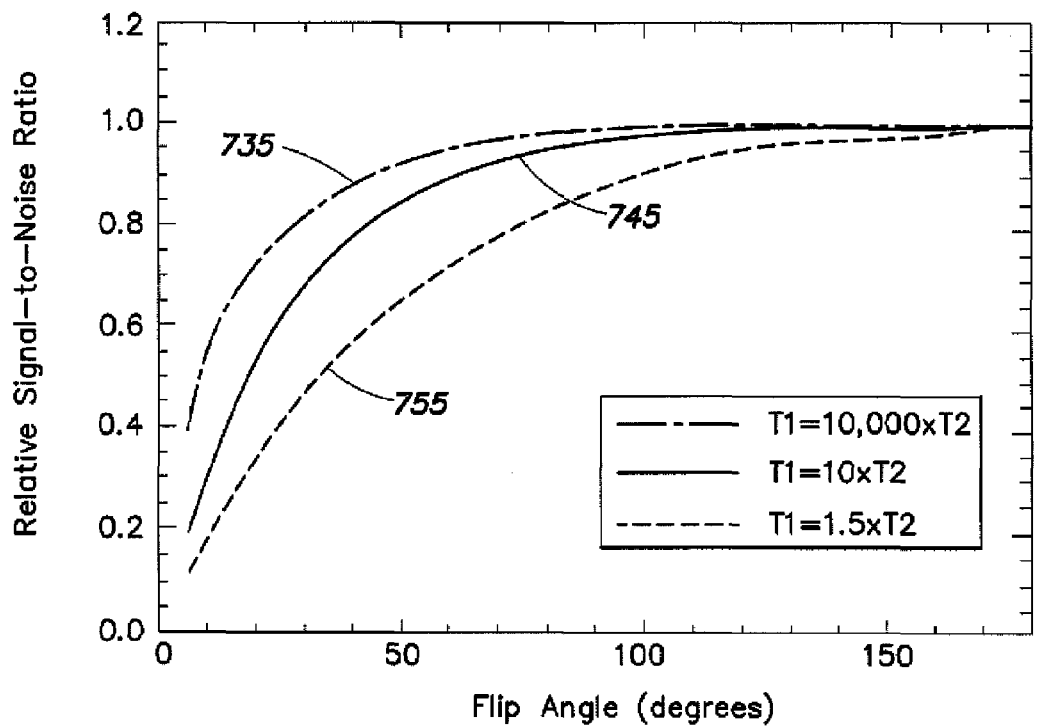

FIGS. 7A and 7B illustrate plots of signal amplitude and signal to noise ratio versus flip angle for pseudo steady states, respectfully. In FIG. 7A, curve 715 (i.e., the solid line) illustrates the theoretical maximum possible signal amplitude achievable in a PSS as a function of flip-angle. Curve 725 (i.e., the dotted line) illustrates the signal amplitude that may be achievable using preparation and transitioning sequences according to some embodiments of the present invention, which closely tracks the theoretical maximum. As illustrated, satisfactory signal amplitudes may be achieved at flip-angles significantly less than 180°. For example, approximately 80% of the signal level achievable at a 180° flip-angle PSS is preserved at a 90° flip-angle PSS, and approximately 60% of the signal level achievable at a 180° flip-angle PSS is preserved at a 50° flip-angle PSS.

More significantly, even less a percentage of the signal-to-noise ratio is forfeited at lower flip angles. FIG. 7B illustrates relative signal-to-noise ratios as a function of flip-angle in a PSS. Three curves are shown for different ratios of relaxation times $T_1$ and $T_2$, as indicated by the legend. For curve 735 (i.e., $T_1=10,000\times T_2$), the signal-to-noise ratio remains at approximately 99% of the maximum at a 90° flip-angle PSS, at approximately 90% of the maximum at a 50° flip-angle PSS, and at approximately 80% of the maximum at a 30° flip-angle. For curve 745 (i.e., $T_1=10\times T_2$), approximately 98% of the signal-to-noise ratio is preserved at a 90° flip-angle PSS, approximately 85% of the signal-to-noise ratio is preserved at a 50° flip-angle PSS, and nearly 70% of the signal-to-noise ratio is preserved at a 30° flip-angle PSS. Even curve 755 (i.e., $T_1=1.5\times T_2$), approximately 85%, 65% and 45% of the maximum signal-to-noise ratio is preserved at a 90°, 50° and 30° flip angle PSS, respectfully.

Accordingly, low flip angle pseudo-steady states may be used without sacrificing substantial signal amplitude and/or signal-to-noise ratio, thus reducing the amount of RF power deposited in the subject being imaged without appreciably degrading image quality. In some embodiments, a transitioning pulse sequence is used to achieve a flip-angle PSS of less than 180°. In other embodiments, a transitioning pulse sequence is used to achieve a flip-angle PSS of less than 150°, 90°, 50° and 30°, respectively. However, any transitioning pulse sequence to achieve or approximate any flip-angle PSS may be used, as the aspects of the invention are not limited in this respect.

Figure 8:
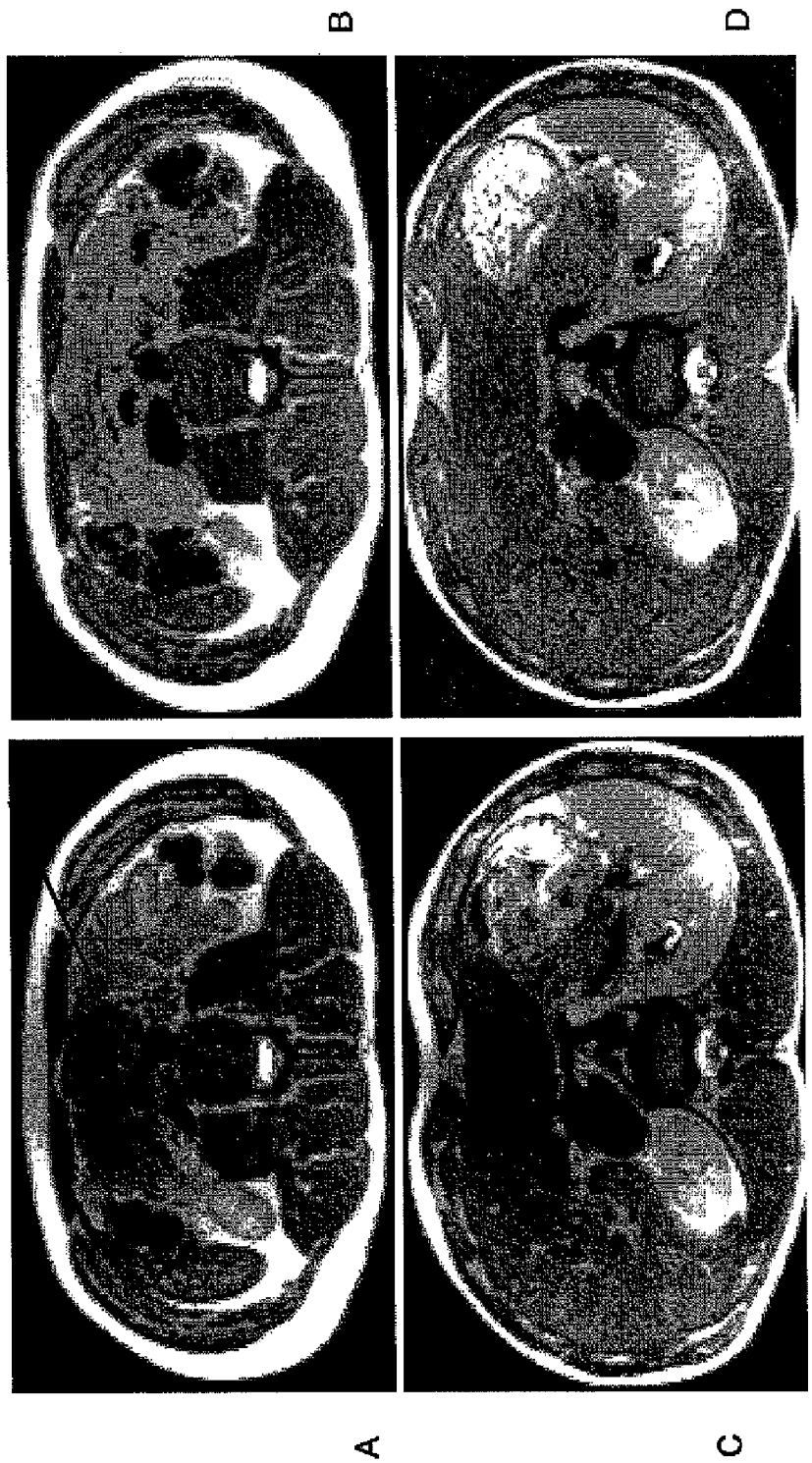
FIG. 8 illustrates images obtained using both conventional spin-echo sequences and pulse sequences in accordance with some embodiments of the present invention.

FIG. 8 illustrates images obtained using conventional spin-echo techniques, and images obtained using pulses sequences according to some embodiments of the present invention. Image A was obtained using conventional spin-echo techniques. Image artifacts due to regions of low RF field amplitude are clearly visible in the generally dark low contrast areas. Image B is the same region obtained using a preparation and transitioning pulse sequence, followed by a spin-echo sequence, in accordance with some embodiments of the present invention. As shown, once prepared and conditioned in a PSS, even regions of relatively low RF field amplitude resulting in high SNR, high contrast image data. Similarly, Image C and D are the same regions obtained using conventional spin-echo techniques and using pulse sequences in accordance with some embodiments of the present invention, respectively.

Figure 9:
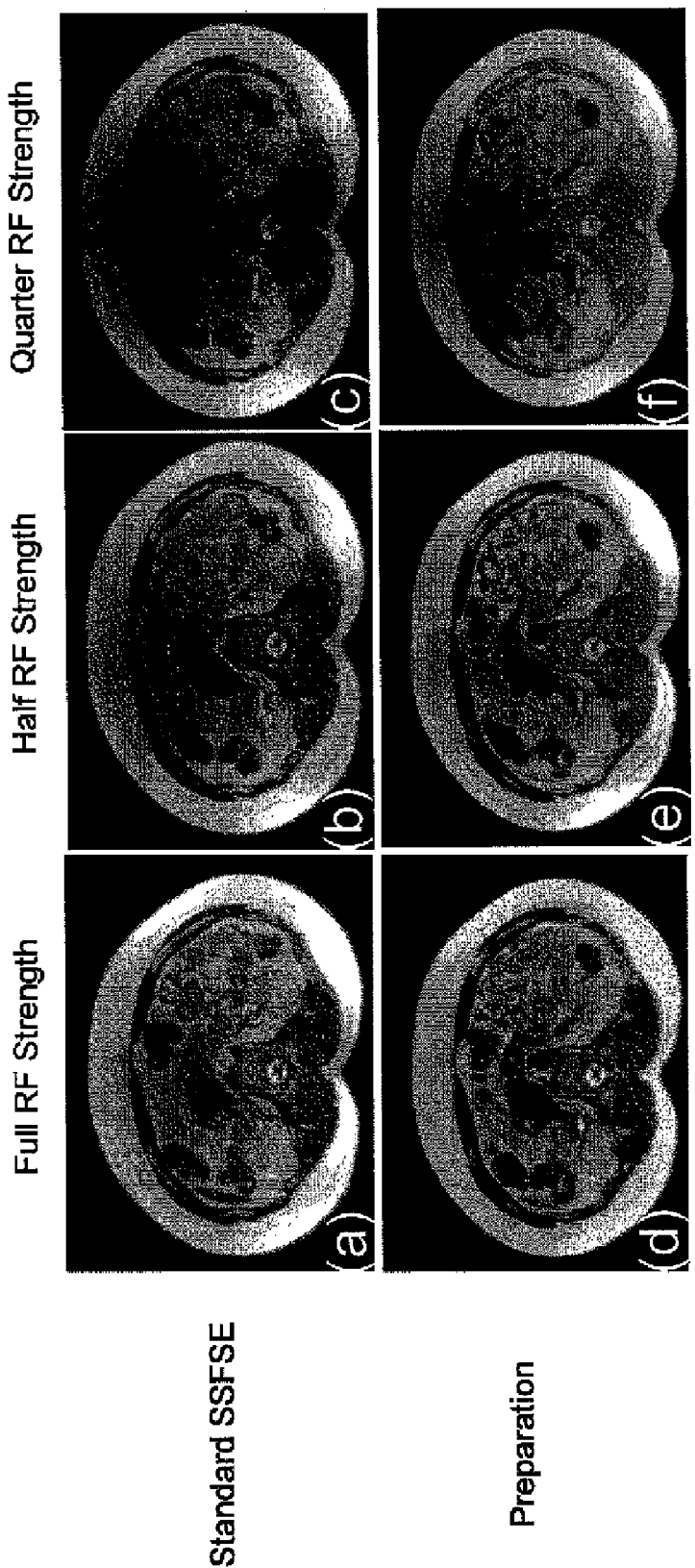
FIG. 9 illustrates images obtained using both conventional spin-echo sequences and pulse sequences in accordance with some embodiments of the present invention at full RF strength, half RF strength and quarter RF strength.

FIG. 9 illustrates images obtained using standard FSE sequences, and images obtained using preparation and transition pulse sequence according to some embodiments of the present invention. The first row (i.e., images (a), (b) and (c)) were obtained using standard FSE sequences at full RF strength, half RF strength and quarter RF strength, respectively. The second row (i.e., images (d), (e) and (f)) were obtained using a preparation and transitioning pulse sequence, followed by a spin-echo sequence at full RF strength, half RF strength and quarter RF strength, respectively. Of particular note is the high signal preservation in images in the second row, even at quarter RF strength.

Figure 10:
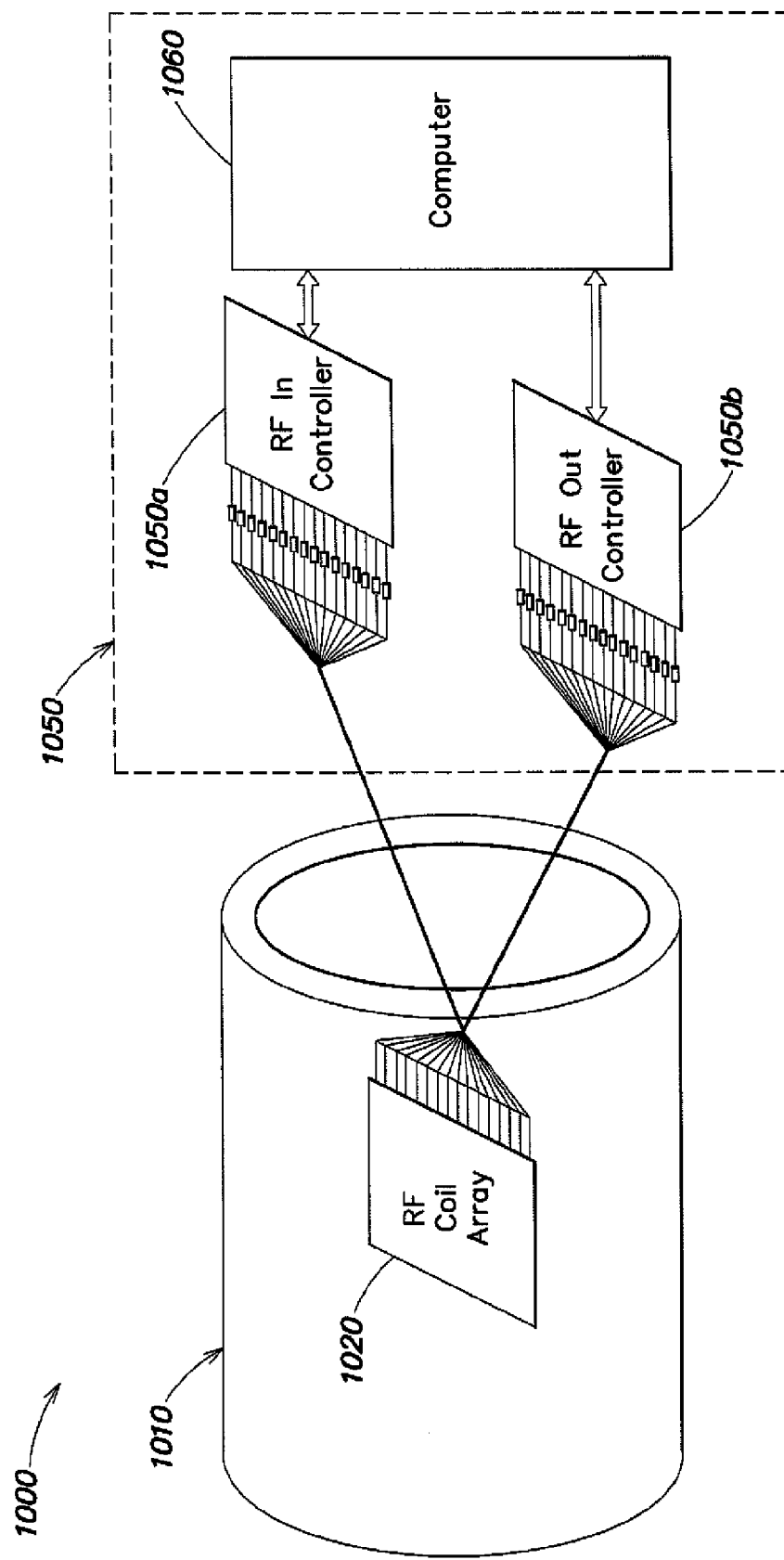
FIG. 10 is a block diagram illustrating an example of an MRI system on which embodiments of the invention may be implemented.

FIG. 10 illustrates an MR scanner configurable to obtain MR images, and more particularly, to obtain NMR data using various pulse sequences described in the foregoing, in accordance with some embodiments of the present invention. Scanner 1000 includes a magnet 1010 capable of producing a magnetic field of desired field strength to align spin properties of molecules of a subject positioned in the interior of the magnet. Magnet 1010 may be any of various MR magnets conventionally used in clinical MRI (e.g., approximately 1.5-3.0 T) or may be a high-field magnet (e.g., 3-7 T or higher) and may produce a uniform or gradient magnetic field. Magnet 1010 may be of any shape, size and strength and is shown as substantially circular in shape for the purposes of schematic illustration only. For example, magnet 1010 may be any magnet or collection of magnets used in clinical or research MRI scanners.

Scanner 1000 includes an array 1020 of one or more RF coils arranged proximate the magnet and adapted to perform at least some MR operations. In particular, the RF coil(s) in coil array 1020 may be adapted to provide RF pulse sequences and to detect NMR signals emitted from an object being imaged. RF coil array may include a single RF coil, or may include multiple RF coils in any configuration, as the aspects of the invention are not limited in this respect. For example, RF coil array 1020 may be an L($M_t$,$N_r$) array where L is the number of coils in the array and $M_t$ and $N_r$ are the number of independent transmit and receive channels, respectively. As stated above, L may indicate a single or multiple coil array.

Scanner 1000 may further include controller 1050 coupled to coil array 1020. Controller 1050 comprises an RF IN controller 1050a and an RF OUT controller 1050b. RF IN controller 1050a is adapted to provide and control RF power to the RF coil array 1020. In particular, RF IN controller 1050a is configured to provide RF power across the M independent transmit channels to respective coils in the array. Similarly, RF OUT controller 1050b is adapted to measure one or more properties of the RF coils over the N independent reception channels in the array. Controller 1050 may be a network analyzer or a custom made controller, signal generator and/or other components adapted to transmit RF power to, and obtain measurements from coil array 1020.

Controller 1050 may include a computer 1060, either connected to RF IN controller 1050a, RF OUT controller 1050b, or both. Computer 1060 may include one or more programs configured to control various aspects of the RF pulse sequences initiated by RF IN controller 1050a and ultimately provided to object being imaged by coil array 1020. For example, computer 1060 may include one or more programs that define the timing, amplitude, phase and any other signal characteristics of RF pulse sequences to be provided by coil array 1020. In particular, computer 1060 may instruct RF IN controller 1050a to excite the coil array according to any of the various RF pulse sequences described in the foregoing.

Computer 1060 may include one or more programs configured to control the synchronization of controller 1050 and/or control the sequencing of various operations performed by scanner 1000. For example, computer 1060 may be configured to synchronize RF IN controller 1050a and RF OUT controller 1050b to provide RF pulse sequences and detect emitted NMR signals, for example, according to various spin-echo and fast spin-echo timing sequences. Computer 1060 may be configured to operate scanner 1000 to transmit and receive signals according to any desired schedule, as the aspects of the invention are not limited in this respect. Thus, controller 1050 may be configured to deliver any of the various pulse sequences described in the foregoing and/or other appropriate or desired pulse sequences.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. It should be appreciated that any component or collection of components that perform the functions described above can be generically considered as one or more controllers that control the above-discussed functions. The one or more controllers can be implemented in numerous ways, such as with dedicated hardware, or with general purpose hardware (e.g., one or more processors) that is programmed using microcode or software to perform the functions recited above.

It should be appreciated that the various methods outlined herein may be coded as software that is executable on one or more processors that employ any one of a variety of operating systems or platforms. Additionally, such software may be written using any of a number of suitable programming languages and/or conventional programming or scripting tools, and also may be compiled as executable machine language code. In this respect, it should be appreciated that one embodiment of the invention is directed to a computer-readable medium or multiple computer-readable media (e.g., a computer memory, one or more floppy disks, compact disks, optical disks, magnetic tapes, etc.) encoded with one or more programs that, when executed, on one or more computers or other processors, perform methods that implement the various embodiments of the invention discussed above. The computer-readable medium or media can be transportable, such that the program or programs stored thereon can be loaded onto one or more different computers or other processors to implement various aspects of the present invention as discussed above.

It should be understood that the term "program" is used herein in a generic sense to refer to any type of computer code or set of instructions that can be employed to program a computer or other processor to implement various aspects of the present invention as discussed above. Additionally, it should be appreciated that according to one aspect of this embodiment, one or more computer programs that, when executed, perform methods of the present invention need not reside on a single computer or processor, but may be distributed in a modular fashion amongst a number of different computers or processors to implement various aspects of the present invention.

Various aspects of the present invention may be used alone, in combination, or in a variety of arrangements not specifically discussed in the embodiments described in the foregoing, and the aspects of the present invention described herein are not limited in their application to the details and arrangements of components set forth in the foregoing description or illustrated in the drawings. The aspects of the invention are capable of other embodiments and of being practiced or of being carried out in various ways. Various aspects of the present invention may be implemented in connection with any type MR imaging equipment of any configuration. No limitations are placed on scanner implementation. Accordingly, the foregoing description and drawings are by way of example only.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing", "involving", and variations thereof herein, is meant to encompass the items listed thereafter and equivalents thereof as well as additional items.

What is claimed is:

1. A method of inducing nuclear magnetic resonance (NMR) signals from a region of an object to be imaged, the method comprising:

applying to the region a preparation sequence configured to substantially establish a zero flip-angle pseudo steady state (PSS) for the region;

applying to the region a transitioning sequence configured to transition the zero flip-angle PSS to a higher target flip-angle PSS; and applying a radio frequency (RF) pulse sequence configured to cause the region to emit detectable NMR signals.

2. The method of claim 1, wherein the preparation sequence includes an RF preparation pulse sequence, wherein pulses in the preparation pulse sequence increase in magnitude during a first preparation interval and then decrease in magnitude during a second preparation interval subsequent to the first preparation interval.

3. The method of claim 2, wherein the envelope of the pulses in the preparation pulse sequence is generally sinusoidal in shape.

4. The method of claim 2, wherein the envelope of the pulses in the preparation pulse sequence is approximately symmetrical in time, the magnitude of the pulses increasing from zero to a maximum amplitude during the first preparation interval and decreasing back to zero during the second preparation interval.

5. The method of claim 2, wherein at least one of the pulses in the preparation pulse sequence is approximately shaped as a hyperbolic secant.

6. The method of claim 2, wherein the transitioning sequence includes an RF transitioning pulse sequence, wherein pulses in the transitioning pulse sequence increase in magnitude during a first transitioning interval.

7. The method of claim 6, wherein the pulses in the transitioning pulse sequence increase from a magnitude of zero to a maximum magnitude during the first transitioning interval.

8. The method of claim 7, wherein pulses in the transitioning pulse sequence maintain the maximum magnitude during a second transitioning interval subsequent the first transitioning interval.

9. The method of claim 6, wherein the transitioning pulse sequence is configured to transition the zero flip-angle PSS through a plurality of incrementally higher flip-angle pseudo steady states to establish the target flip-angle PSS.

10. The method of claim 6, wherein the transitioning pulse sequence is configured to establish a target flip-angle PSS of less than 180° C.

11. The method of claim 6, wherein the transitioning pulse sequence is configured to establish a target flip-angle PSS of less than 90° C.

12. The method of claim 6, wherein the transitioning pulse sequence is configured to establish a target flip-angle PSS of less than 50° C.

13. The method of claim 6, wherein the transitioning pulse sequence is configured to establish a target flip-angle PSS of less than 30° C.

14. The method of claim 6, wherein the RF pulse sequence configured to cause the region to emit detectable NMR signals includes a plurality of refocusing pulses configured to cause a flip-angle substantially equal to the target flip angle.

15. The method of claim 6, wherein the refocusing pulse sequence is at least one of a spin-echo, a fast spin-echo, and a rapid acquisition with relaxation enhancement (RARE) pulse sequence.

16. The method of claim 15, wherein an interval between pulses in the preparation pulse sequence is substantially half of a spin-echo period.

17. The method of claim 15, wherein an interval between pulses in the transitioning pulse sequence is substantially equal to a spin-echo period.

18. The method of claim 1, wherein the region comprises a region of a human body.

19. The method of claim 2, further comprising:
applying to the region a magnetic field $B_0$;
wherein the RF preparation pulse sequence is configured to establish the zero flip-angle PSS by aligning nuclear spins within the region such that the nuclear spins alternate direction along an orientation that is approximately parallel to the magnetic field $B_0$.

20. The method of claim 19, wherein the nuclear spins alternate direction in a square wave fashion as a function of location in the region and spin frequency.

21. An apparatus adapted to deliver sequences configured to cause a region of an object to be imaged to emit NMR signals, the apparatus comprising:
a transmit component adapted to provide radio frequency (RF) electromagnetic radiation to a region;
a reception component adapted to detect NMR signals emitted from the region; and
a controller adapted to operate the transmit component to provide a preparation sequence configured to substantially establish a zero flip-angle pseudo steady state (PSS) for the region, a transitioning sequence configured to transition an established zero flip-angle PSS to a higher target flip-angle PSS, and a radio frequency (RF) pulse sequence configured to cause the region to emit detectable NMR signals.

22. The apparatus of claim 21, wherein the preparation sequence includes an RF preparation pulse sequence, wherein pulses in the preparation pulse sequence increase in magnitude during a first preparation interval and then decrease in magnitude during a second preparation interval subsequent to the first preparation interval.

23. The apparatus of claim 22, wherein the envelope of the pulses in the preparation pulse sequence is generally sinusoidal in shape.

24. The apparatus of claim 22, wherein the envelope of the pulses in the preparation pulse sequence is approximately symmetrical in time, the magnitude of the pulses increasing from zero to a maximum amplitude during the first preparation interval and decreasing back to zero during the second preparation interval.

25. The apparatus of claim 22, wherein at least one of the pulses in the preparation pulse sequence is approximately shaped as a hyperbolic secant.

26. The apparatus of claim 22, wherein the transitioning sequence includes an RF transitioning pulse sequence, wherein pulses in the transitioning pulse sequence increase in magnitude during a first transitioning interval.

27. The apparatus of claim 26, wherein the pulses in the transitioning pulse sequence increase from a magnitude of zero to a maximum magnitude during the first transitioning interval.

28. The apparatus of claim 27, wherein pulses in the transitioning pulse sequence maintain the maximum magnitude during a second transitioning interval subsequent the first transitioning interval.

29. The apparatus of claim 26, wherein the transitioning pulse sequence is configured to transition the zero flip-angle PSS through a plurality of incrementally higher flip-angle pseudo steady states to establish the target flip-angle PSS.

30. The apparatus of claim 29, wherein the transitioning pulse sequence is configured to establish a target flip-angle PSS of less than 180° C.

31. The apparatus of claim 29, wherein the transitioning pulse sequence is configured to establish a target flip-angle PSS of less than 90° C.

32. The apparatus of claim 29, wherein the transitioning pulse sequence is configured to establish a target flip-angle PSS of less than 50° C.

33. The apparatus of claim 29, wherein the transitioning pulse sequence is configured to establish a target flip-angle PSS of less than 30° C.

34. The apparatus of claim 26, wherein the RF pulse sequence configured to cause the region to emit detectable NMR signals includes a plurality of refocusing pulses configured to cause a flip-angle substantially equal to the target flip angle.

35. The apparatus of claim 26, wherein the refocusing pulse sequence is at least one of a spin-echo, a fast spin-echo, and a rapid acquisition with relaxation enhancement (RARE) pulse sequence.

36. The apparatus of claim 35, wherein an interval between pulses in the preparation pulse sequence is substantially half of a spin-echo period.

37. The apparatus of claim 35, wherein an interval between pulses in the transitioning pulse sequence is substantially equal to a spin-echo period.

38. The apparatus of claim 21, wherein the region comprises a region of a human body.

39. The apparatus of claim 22, further comprising a magnet capable of applying to the region a magnetic field $B_0$, and wherein the RF preparation pulse sequence is configured to establish the zero flip-angle PSS by aligning nuclear spins within the region such that the nuclear spins alternate direction along an orientation that is approximately parallel to the magnetic field $B_0$.

40. The apparatus of claim 39, wherein the nuclear spins alternate direction in a square wave fashion as a function of location in the region and spin frequency.

41. The apparatus of claim 21, wherein the transmit component includes an RF out signal generator and an RF coil array having at least one RF coil array, wherein the signal generator provides power to the RF coil array to provide the RF electromagnetic energy.

42. The apparatus of claim 41, wherein the receive component includes the RF coil array and a measurement component to detect disturbances in the RF coil array caused by the NMR signals emitted from the region.

* * * * *